(12) United States Patent
Lo et al.

(10) Patent No.: US 7,795,119 B2
(45) Date of Patent: Sep. 14, 2010

(54) FLASH ANNEAL FOR A PAI, NISI PROCESS

(75) Inventors: Chia Ping Lo, Jhubei (TW); Jerry Lai, Keelung (TW); Chii-Ming Wu, Taipei (TW); Mei-Yun Wang, Hsin-Chu (TW); Da-Wen Lin, Taiping (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 273 days.

(21) Appl. No.: 11/779,187

(22) Filed: Jul. 17, 2007

(65) Prior Publication Data
US 2009/0020757 A1    Jan. 22, 2009

(51) Int. Cl.
*H01L 21/04* (2006.01)
(52) U.S. Cl. .......... 438/510; 257/E21.12; 257/E21.324; 257/E21.454; 257/E21.497
(58) Field of Classification Search ................. 438/486, 438/795, 510; 257/E21.12, E21.324, E21.454, 257/E21.497
See application file for complete search history.

(56) References Cited

U.S. PATENT DOCUMENTS

| | | | |
|---|---|---|---|
| 5,066,610 A | 11/1991 | Chen et al. | |
| 5,298,441 A | 3/1994 | Goronkin et al. | |
| 5,561,302 A | 10/1996 | Candelaria | |
| 5,610,088 A | 3/1997 | Chang et al. | |
| 6,004,871 A | 12/1999 | Kittl et al. | |
| 6,335,249 B1 | 1/2002 | Thei et al. | |
| 6,492,216 B1 | 12/2002 | Yeo et al. | |
| 6,624,489 B2 | 9/2003 | Chong et al. | |
| 6,638,838 B1 | 10/2003 | Eisenbeiser et al. | |
| 6,841,430 B2 | 1/2005 | Sugawara et al. | |
| 6,930,007 B2 | 8/2005 | Bu et al. | |
| 6,982,181 B2 | 1/2006 | Hideo | |
| 7,129,127 B2 | 10/2006 | Chidambaram et al. | |
| 7,135,423 B2 * | 11/2006 | Downey | 438/795 |
| 7,259,075 B2 * | 8/2007 | Mineji | 438/303 |
| 2002/0008289 A1 | 1/2002 | Murota et al. | |
| 2002/0125497 A1 | 9/2002 | Fitzgerald | |

(Continued)

FOREIGN PATENT DOCUMENTS

CN        1 892 998 A        1/2007

OTHER PUBLICATIONS

Alshehri, Y. A., "Development of a Full Silicidation (FUSI) Process for Nickel Silicide," $22^{nd}$ Annual Microelectronic Engineering Conference, May 2004, pp. 52-56.

(Continued)

*Primary Examiner*—Davienne Monbleau
*Assistant Examiner*—Monica D Harrison
(74) *Attorney, Agent, or Firm*—Slater & Matsil, L.L.P.

(57) ABSTRACT

A structure and a method for mitigation of the damage arising in the source/drain region of a MOSFET is presented. A substrate is provided having a gate structure comprising a gate oxide layer and a gate electrode layer, and a source and drain region into which impurity ions have been implanted. A PAI process generates an amorphous layer within the source and drain region. A metal is deposited and is reacted to create a silicide within the amorphous layer, without exacerbating existing defects. Conductivity of the source and drain region is then recovered by flash annealing the substrate.

20 Claims, 7 Drawing Sheets

U.S. PATENT DOCUMENTS

| | | |
|---|---|---|
| 2002/0192914 A1 | 12/2002 | Kizilyalli et al. |
| 2004/0115888 A1 | 6/2004 | Chang |
| 2004/0173812 A1 | 9/2004 | Currie et al. |
| 2004/0212035 A1 | 10/2004 | Yeo et al. |
| 2004/0259326 A1 | 12/2004 | Hideo |
| 2004/0266080 A1 | 12/2004 | Jyumonji et al. |
| 2005/0059228 A1 | 3/2005 | Bu et al. |
| 2005/0164431 A1 | 7/2005 | Bu et al. |
| 2005/0253166 A1 | 11/2005 | Ke et al. |
| 2005/0266591 A1 | 12/2005 | Hideo |
| 2005/0272215 A1 | 12/2005 | Lee |
| 2006/0172556 A1 | 8/2006 | Bather et al. |
| 2006/0286758 A1 | 12/2006 | Liang et al. |
| 2007/0010073 A1* | 1/2007 | Chen et al. .................. 438/486 |

OTHER PUBLICATIONS

Chen, C-H., et al., "Stress Memorization Technique (SMT) by Selectively Strained-Nitride Capping for Sub-65nm High-Performance Strained-Si Device Application," Symposium on VLSI Technology Digest of Technical Papers, IEEE, 2004, pp. 56-57.

\* cited by examiner

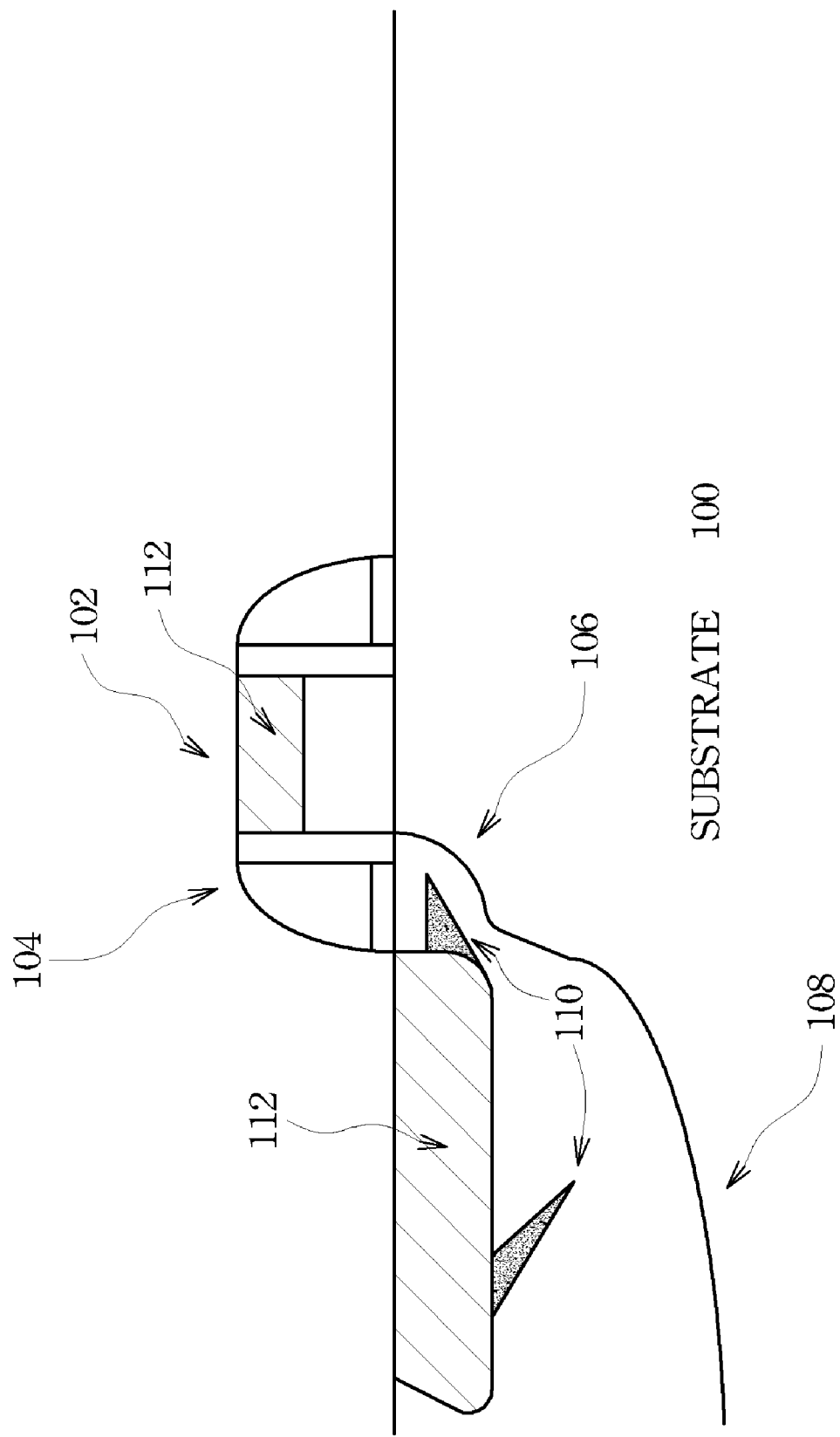

US 7,795,119 B2

FLASH ANNEAL FOR A PAI, NISI PROCESS

TECHNICAL FIELD

The present invention relates generally to a system and method of manufacturing a semiconductor device, and more particularly to a system and method for mitigating source/drain defects in the semiconductor device by implementing pre-amorphous implant (PAI), NiSi silicidation and flash anneal processes.

BACKGROUND

Complementary metal oxide semiconductor (CMOS) field effect transistor (FET) technology involves the formation and utilization of n-channel FETs (NMOS) and p-channel FETs (PMOS) in combination (MOSFETs) to form low current, high performance integrated circuits.

In sub-micron semiconductor technology, the use of self-aligned silicide processes has become widely accepted to minimize device series resistance. The silicide process is defined by introducing metal into silicon, which may overcome the high resistivity between metal and polysilicon gates and source/drain regions in MOSFETs. In the self-aligned silicide process, the polysilicon is deposited and patterned followed by a metal deposition. Then, the silicide is formed by thermal reaction. A disadvantage of the silicide process is the exacerbation of the stress related defects formed in the source/drain region.

A pre-amorphous implant (PAI) may confine the silicide formation to the PAI-induced amorphous layer. While the use of a PAI process for relieving stress-retarded reaction and increasing nucleation density is known, there are disadvantages with the PAI process. One such disadvantage of the PAI process is that the PAI process may degrade source/drain conductivity. Typical anneal processes do not cure this deficiency. Yet another disadvantage may be the degraded resistance in PMOS gated diodes, causing a degraded PMOS performance.

SUMMARY OF THE INVENTION

These and other problems are generally solved or circumvented, and technical advantages are generally achieved, by a system and method for mitigating source/drain defects by implementing pre-amorphous implant (PAI), NiSi silicidation and flash anneal processes.

In accordance with a preferred embodiment of the present invention, a system for mitigating the damage arising in the source/drain region of a MOSFET includes a substrate with at least a gate structure comprising a gate oxide layer and a gate electrode layer, a source and drain region in which impurity ions have been implanted, a PAI-induced amorphous layer, a Ni silicide layer confined within the amorphous layer, and a source/drain region subjected to a flash anneal.

An advantage of a preferred embodiment of the present invention is that the effects of pipe defects and spike structures may be reduced or eliminated. A further advantage of a preferred embodiment of the present invention is that the conductivity of the source/drain region may be recovered, following the PAI process, by the flash anneal process.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1b illustrates the exacerbation of the source/drain defects in a prior art silicidation method;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a drain region of a MOSFET. The invention may also be applied, however, to other areas of the MOSFET, including the source region.

Figure 1A:
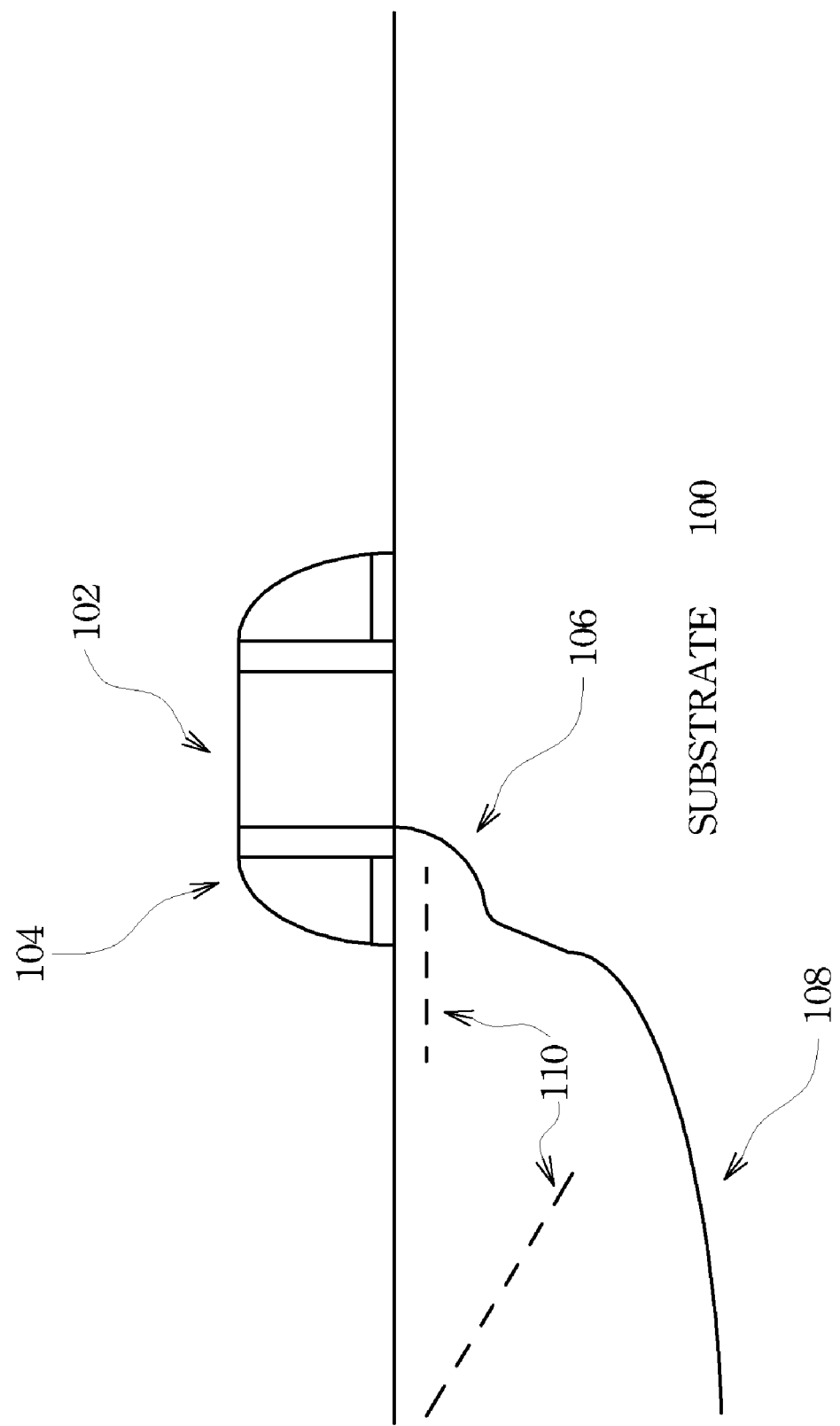
FIG. 1a is a cross sectional view of the damage in a source/drain region.

With reference now to FIG. 1a, a cross-sectional view of the un-repaired damage of a source/drain region of a prior art method is shown. Substrate 100 is a part of MOSFET shown with gate region 102. Gate region 102 comprises a gate electrode region of poly silicon and a thin gate oxide region (not explicitly shown). Spacer region 104 is shown abutting gate region 102 in an area over the lightly doped drain region 106 of the MOSFET. Of course, those of ordinary skill in the art will understand that this may be a symmetrical source/drain process, although not shown in the figures. The heavier doped drain region 108 contains extended defects 110. Turning to FIG. 1b, substrate 100 is shown after silicide formation and anneal. Silicide layer 112 is shown within drain regions 106 and 108. Silicide formation may amplify defect lines 110 in drain region 108 and lightly doped drain region 106. These defects may increase the probability of device degradation and failure.

Figure 2A:
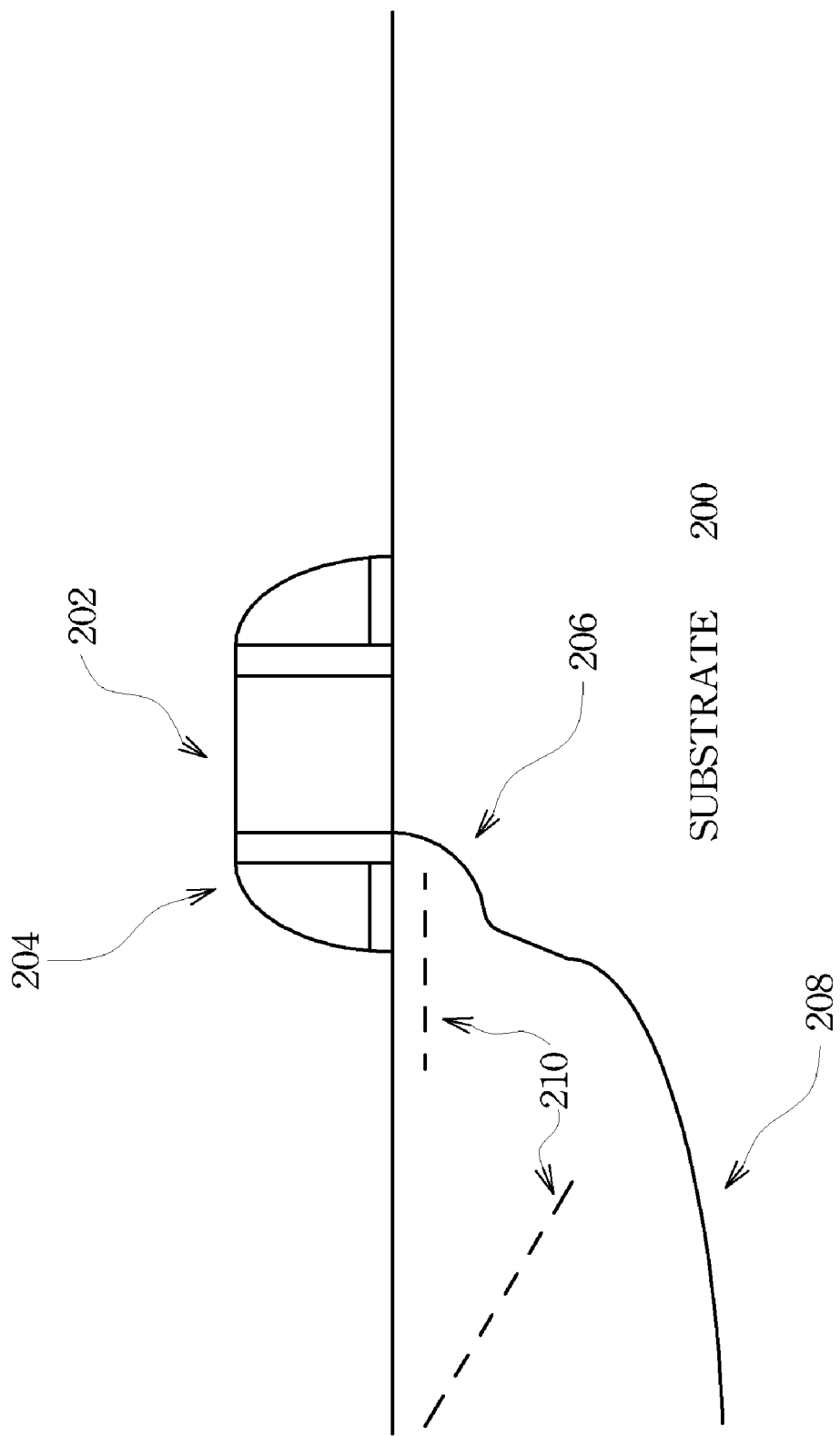
FIGS. 2a, 2b, and 2c show cross sectional views of a source/drain region during a repair process executed in accordance with the illustrative embodiments.
Figure 2B:
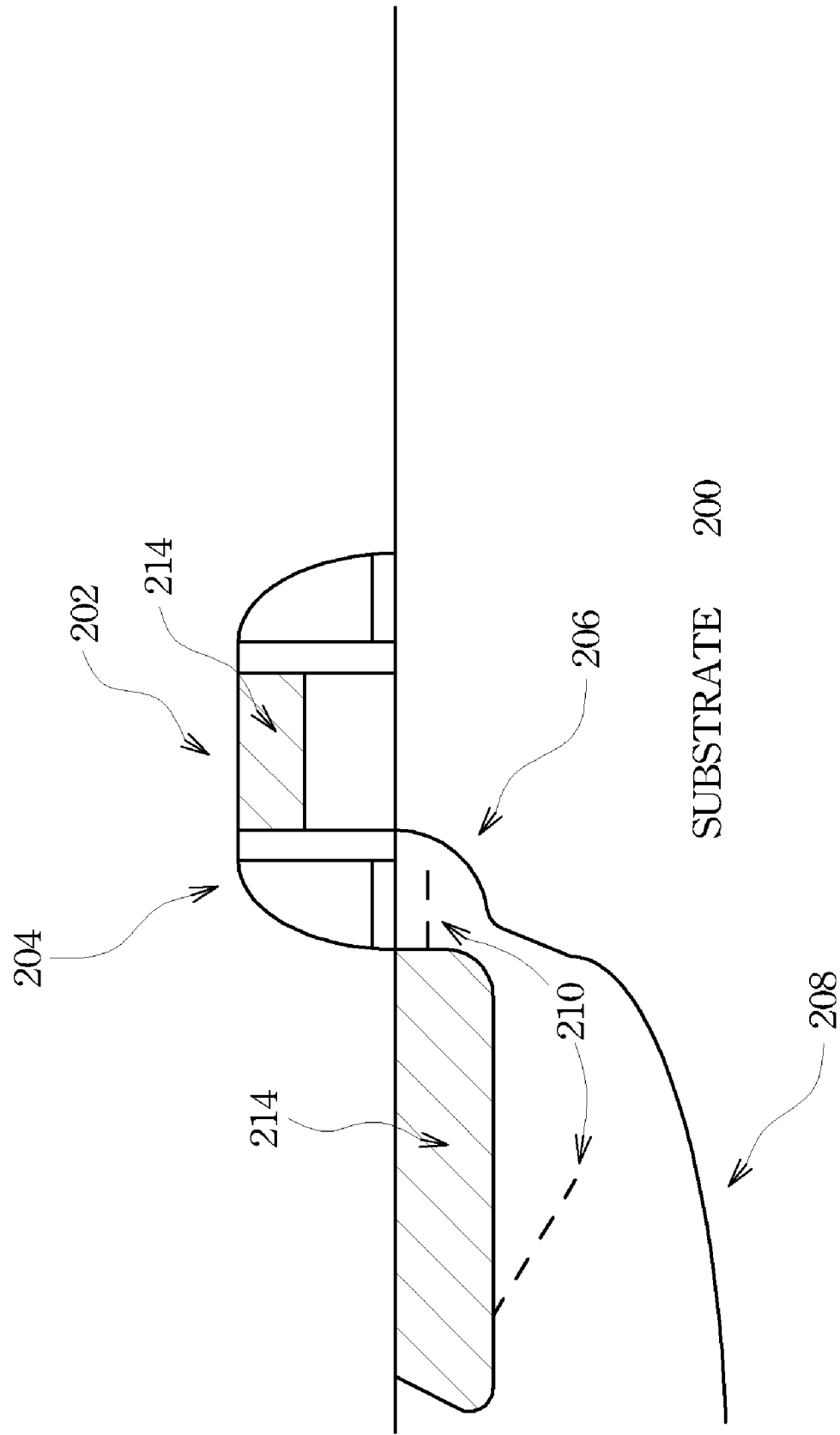
Figure 2C:
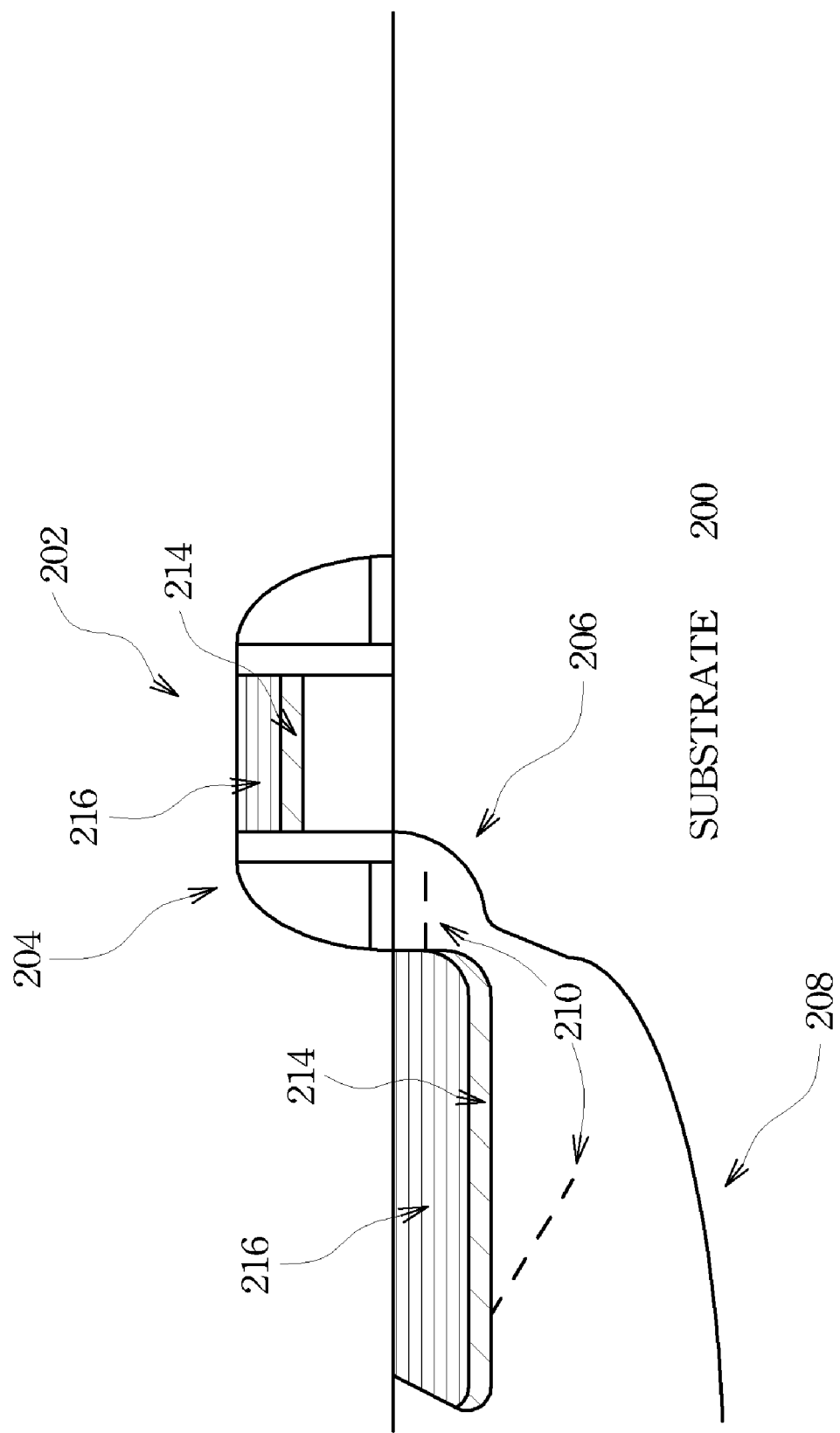

FIGS. 2a, 2b, and 2c show cross-sectional views of a source/drain region during a repair process executed in accordance with the illustrative embodiments. FIG. 2a is a similar structure as FIG. 1a showing a substrate 200, gate region 202, spacer region 204, lightly doped drain region 206, drain region 208, and extended defects 210 after a source/drain implant and anneal. FIG. 2b shows substrate 200 following a pre-amorphous implant process. PAI implant regions 214 are amorphous layers and therefore do not exacerbate the defects. Finally, turning to FIG. 2c, substrate 200 is shown post silicide formation and anneal. Silicidation layer 216 is formed in PAI implant regions 214. Note the extended defect lines are not exacerbated by the silicide formation because the silicide is contained within the amorphous region. Device performance may improve. A further process in accordance with the illustrative embodiments is a flash anneal which may recover conductivity in the source/drain region lost to damage caused by the PAI implant.

Figure 3:
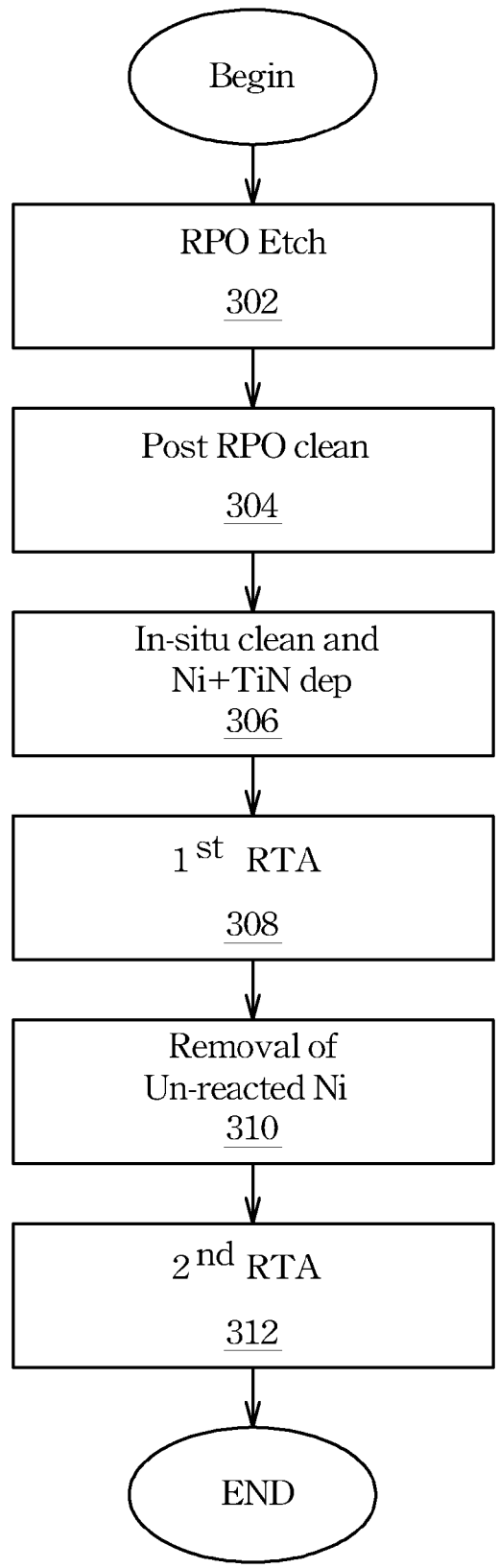
FIG. 3 is a previous process flow.

FIG. 3 illustrates the prior art process flow of FIG. 1. The method begins with a substrate that has already undergone standard wafer processing, including source/drain implants and anneal. A standard resist protect oxide (RPO) etch (step 302) is performed on the substrate. Post RPO clean (step 304) follows. A wet clean is typically implemented; however, a dry process may be within the scope of this embodiment. An in situ clean and Ni+TiN deposition (step 306) is performed and a first rapid thermal anneal (RTA) (step 308) is completed, forming a silicide layer, such as silicide layer 112 in FIG. 1b. Subsequent processing, such as removing the unreacted Ni (step 310) and the second anneal process (312), does not repair the damage caused by silicidation of the extended defects as shown in FIG. 1b.

Figure 4:
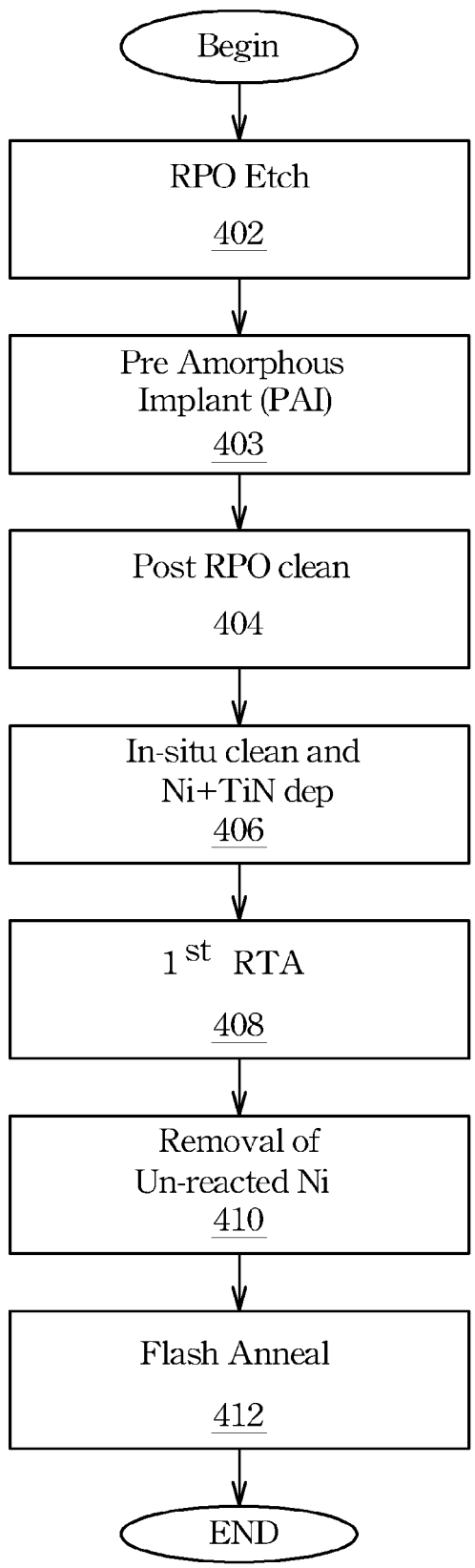
FIG. 4 is a process flow in accordance with the illustrative embodiments.

Turning to FIG. 4, a process flow in accordance with the illustrative embodiments is shown. As in the process flow shown in FIG. 3, before the steps illustrated, standard wafer processing including source/drain implants and anneal are implemented. A standard RPO etch (step 402) is performed. Next, the illustrated method provides a PAI process (step 403) on the substrate. The PAI comprises a two-step implant process of Xe ions. Xe is the preferred species because it is a heavy ion with the appropriate inertial properties. The first implant is at an energy of about 5 KeV to 30 KeV, preferably 10 KeV, a dose of around 5 E13 to 5 E14 atoms per square centimeter (atm/cm$^2$) with an implant tilt approximating 10 degrees. The second implant is at an energy of about 7 KeV to 30 KeV, preferably 15 KeV, and a dose of 5 E13 to 5 E14 atm/cm$^2$ with a 10-degree implant tilt. Doses, energies, and tilt angles may be varied within the spirit and scope of this illustrative embodiment. However, care must be taken not to perform the PAI at too high an energy or at too high a dose because an implant energy or higher dose than these ranges may cause device leakage.

Post RPO clean (step 404), in-situ clean and Ni+TiN deposition (step 406), RTA (step 408), and removal of un-reacted metals (step 410) follows. Nickel silicide emerged as a prominent candidate for silicide applications for the sub 65 nm advance technology devices. NiSi has many advantages over both titanium and cobalt silicides because of its low consumption rate of silicon, low resistivity (reported to be in the range of 15~20 μOhm/cm), and most importantly, limited or no narrow-line effects. The NiSi formation process can be performed in a single step annealing, forming the low resistivity NiSi phase followed by a selective etch removal of the unreacted nickel. NiSi has been reported to form at temperatures around 500 C, allowing for a lower thermal budget. At higher temperatures of 750 C and above, another phase of nickel silicide is formed, nickel disilicide. Nickel disilicide has a higher resistivity than NiSi, around 50 μOhm/cm. The silicon agglomeration in the NiSi$_2$ film takes place at higher temperatures, causing the higher resistivity, which may cause a serious degradation in the performance of the devices. However, other metal systems may be used in accordance with this illustrative embodiment.

Following the removal of un-reacted Ni (step 410), the substrate is then flash annealed (step 412). Flash annealing is a hybrid of spike annealing sub-melt LTA (laser thermal anneal). Using an arc lamp discharge to illuminate only the device side of the wafer the junction experiences temperatures up to ~1300 C with Tpeak −50 C lasting ~330 microseconds as it is cooled by conduction to the wafer back-side. Diffusion is minimized due to the time and the solid solubility of the peak temperature obtained.

Below is the flash anneal step 412 compared to a second RTA step, such as step 312 in FIG. 3.

| Process | Second RTA | Flash anneal |
| --- | --- | --- |
| Equipment | Heatpulse | lightpulse |
| Pre Heat temperature | 200° C.-300° C. | 100° C.-300° C. |
| Heat Ramp rate | 5° C.-15° C. | No definition |
| Maximum temperature | <500° C. preferred | <1050° C. preferred |
| Cool Ramp rate | 10° C.-30° C. | No definition |
| Energy | No definition | (15 J-50 J) < 25 J preferred |

Although the present invention and its advantages have been described in detail, it should be understood that various changes, substitutions, and alterations can be made herein without departing from the spirit and scope of the invention as defined by the appended claims. For example, it will be readily understood by those skilled in the art that flash anneal temperatures and times may be varied while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for mitigating damage arising in source/drain region of a MOSFET, the method comprising:
   providing a substrate with at least a gate structure comprising:
      a gate oxide layer;
      a gate electrode layer; and
      a source and drain region in which impurity ions have been implanted;
   implanting an ion species causing an amorphous layer in the substrate;
   depositing and reacting a metal in the source and drain region; and
   flash annealing the substrate after the depositing and reacting.

2. The method of claim 1, wherein the ion species causing an amorphous layer is Xenon.

3. The method of claim 2, wherein the Xenon is implanted in a two step process.

4. The method of claim 3, wherein the Xenon is implanted in a first step at about 5 to 30 KeV and the Xenon is implanted in a second step at about 7 to 30 KeV.

5. The method of claim 3, wherein the Xenon is implanted with a tilt angle of 10 degrees.

6. The method of claim 3, wherein the Xenon is implanted in a first step with a dose of about 5 E13 to 5 E14 atm/cm$^2$ and the Xenon is implanted in a second step with a dose of about 5 E13 to 5 E14 atm/cm$^2$.

7. The method of claim 1, wherein the metal consists of one of Ni and Ni+Ti.

8. The method of claim 1, wherein the flash anneal process has a preheat step.

9. The method of claim 8, wherein a temperature of the preheat step is between 250° C. and 350° C.

10. The method of claim 1, wherein the flash anneal process is implemented with an energy of about 30 J to 46 J.

11. A method of manufacturing a semiconductor device, the method comprising:
providing a substrate with at least a gate structure comprising:
a gate oxide layer;
a gate electrode layer; and
a source and drain region in which impurity ions have been implanted;
generating an amorphous layer in the source and drain region using a Xenon two step PAI process;
depositing a Ni metal on the amorphous layer;
forming a Ni silicide layer within the amorphous layer; and
flash annealing the substrate.

12. A method of forming a semiconductor device, the method comprising:
providing a substrate with at least a gate structure comprising:
a gate oxide layer;
a gate electrode layer; and
a source and drain region in which impurity ions have been implanted;
depositing and reacting a metal in the source and drain region; and
flash annealing the substrate after the depositing and reacting.

13. The method of claim 12, wherein the metal consists of one of Ni and Ni+Ti.

14. The method of claim 12, wherein the flash anneal process has a preheat step.

15. The method of claim 14, wherein a temperature of the preheat step is between 250° C. and 350° C.

16. The method of claim 12, wherein the flash anneal process is implemented with an energy of about 30 J to 46 J.

17. The method of claim 12, wherein the flash anneal process is performed by lightpulse equipment and has a process temperature from about 500° C. to about 1050° C.

18. The method of claim 12, wherein the depositing and reacting comprises rapid thermally annealing the substrate for forming silicide in the source and drain region.

19. The method of claim 18, further comprising removing an unreacted metal in the source and drain region after the rapid thermally annealing and before the flash annealing.

20. The method of claim 12, further comprising implanting an ion species causing an amorphous layer in the source and drain region

* * * * *